US011286563B2

(12) United States Patent
Komori

(10) Patent No.: US 11,286,563 B2
(45) Date of Patent: Mar. 29, 2022

(54) SUBSTRATE PROCESSING APPARATUS, SUBSTRATE PROCESSING SYSTEM, AND SUBSTRATE PROCESSING METHOD

(71) Applicant: Tokyo Electron Limited, Tokyo (JP)

(72) Inventor: Eiichi Komori, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 138 days.

(21) Appl. No.: 16/688,628

(22) Filed: Nov. 19, 2019

(65) Prior Publication Data
US 2020/0157681 A1    May 21, 2020

(30) Foreign Application Priority Data

Nov. 21, 2018   (JP) .............................. JP2018-218509

(51) Int. Cl.
*C23C 16/455*    (2006.01)
(52) U.S. Cl.
CPC .. *C23C 16/45544* (2013.01); *C23C 16/45561* (2013.01)
(58) Field of Classification Search
None
See application file for complete search history.

(56) References Cited

U.S. PATENT DOCUMENTS

| 2006/0099053 | A1* | 5/2006 | Saito ....................... | C23C 16/44 414/217 |
| 2017/0081764 | A1* | 3/2017 | Aburatani ......... | C23C 16/45574 |
| 2017/0183773 | A1* | 6/2017 | Okura ............... | C23C 16/45527 |

FOREIGN PATENT DOCUMENTS

| CN | 106544647 A | 3/2017 |
| CN | 106661730 A | 5/2017 |
| JP | 2004-265917 A | 9/2004 |

* cited by examiner

*Primary Examiner* — Shamim Ahmed
*Assistant Examiner* — Bradford M Gates
(74) *Attorney, Agent, or Firm* — Fenwick & West LLP

(57) ABSTRACT

In a substrate processing apparatus for performing substrate processing by supplying, to a substrate, a source gas containing a source material of a film to be formed on the substrate, a processing chamber in which the substrate is mounted is provided. A source gas supply unit is configured to contain the source material and supplies the source gas toward the processing chamber. A buffer tank is configured to temporarily store the source gas received from the source gas supply unit. A valve arrangement unit in which supply on/off valves, each of which is configured to perform a supply and a shut-off of the supply of the source gas stored in the buffer tank to the processing chamber, are arranged. The valve arrangement unit, the buffer tank, and the source gas supply unit are arranged, in this order, above the processing chamber from the bottom side of the substrate processing apparatus.

10 Claims, 7 Drawing Sheets

SUBSTRATE PROCESSING APPARATUS, SUBSTRATE PROCESSING SYSTEM, AND SUBSTRATE PROCESSING METHOD

CROSS-REFERENCE TO RELATED APPLICATIONS

This application claims priority to Japanese Patent Application No. 2018-218509, filed on Nov. 21, 2018, the entire contents of which are incorporated herein by reference.

TECHNICAL FIELD

The present disclosure relates to a technique for processing a substrate.

BACKGROUND

In a semiconductor device manufacturing process, for example, there is known a substrate processing apparatus in which a substrate is mounted in a processing chamber, and a source gas containing a source material of a film to be formed on the substrate is supplied from a source gas supply unit to the processing chamber in order to process the substrate.

For example, Japanese Patent Application Publication No. 2004-265917 discloses a vacuum processing apparatus that performs processing by supplying a source gas to a substrate placed in a chamber (processing chamber) in a vacuum atmosphere. Japanese Patent Application Publication No. 2004-265917 describes that it is preferred that a source container (source gas supply unit) for containing the source material supplied to the chamber is disposed above a chamber lid (processing chamber lid), and this configuration allows a distance between the source container and the chamber to be shortened and also allows a diameter of a gas supply line to be increased without increasing the area occupied by the line.

In view of the above, the present disclosure provides a technique capable of reducing the footprint of an apparatus and supplying a source gas stably to a processing chamber in a substrate processing apparatus that performs processing by supplying the source gas to a substrate mounted in the processing chamber.

SUMMARY

In accordance with an aspect of the present disclosure, there is provided a substrate processing apparatus for performing substrate processing by supplying, to a substrate, a source gas containing a source material of a film to be formed on the substrate, the substrate processing apparatus comprising: a processing chamber in which the substrate is mounted; a source gas supply unit configured to contain the source material and supply the source gas toward the processing chamber; a buffer tank configured to temporarily store the source gas received from the source gas supply unit; and a valve arrangement unit in which supply on/off valves, each of which is configured to perform a supply and a shut-off of the supply of the source gas stored in the buffer tank to the processing chamber, are arranged. Further, the valve arrangement unit, the buffer tank, and the source gas supply unit are arranged, in this order, above the processing chamber from the bottom side of the substrate processing apparatus.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
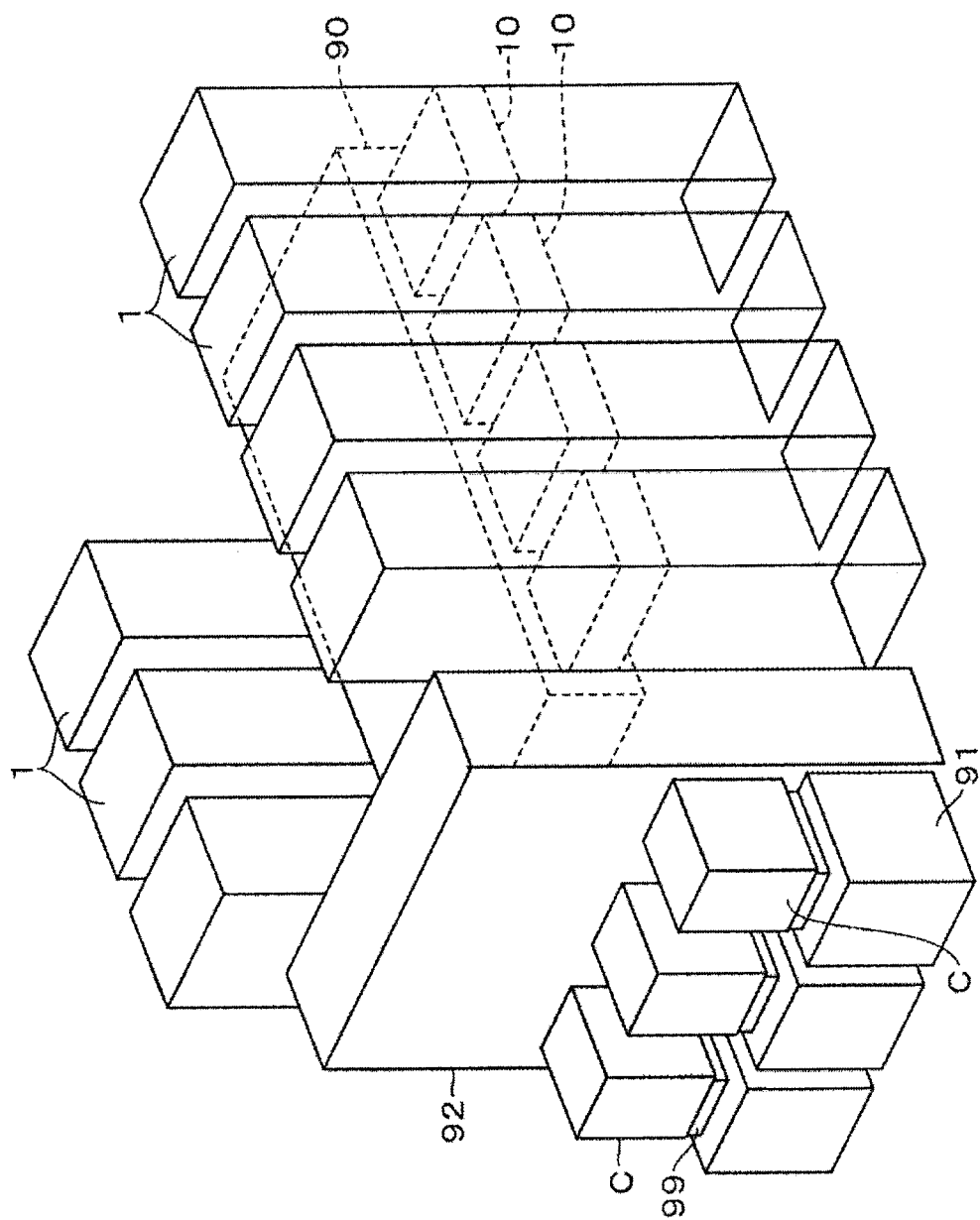
FIG. 1 is a perspective view showing a vacuum processing system according to an embodiment.
Figure 2:
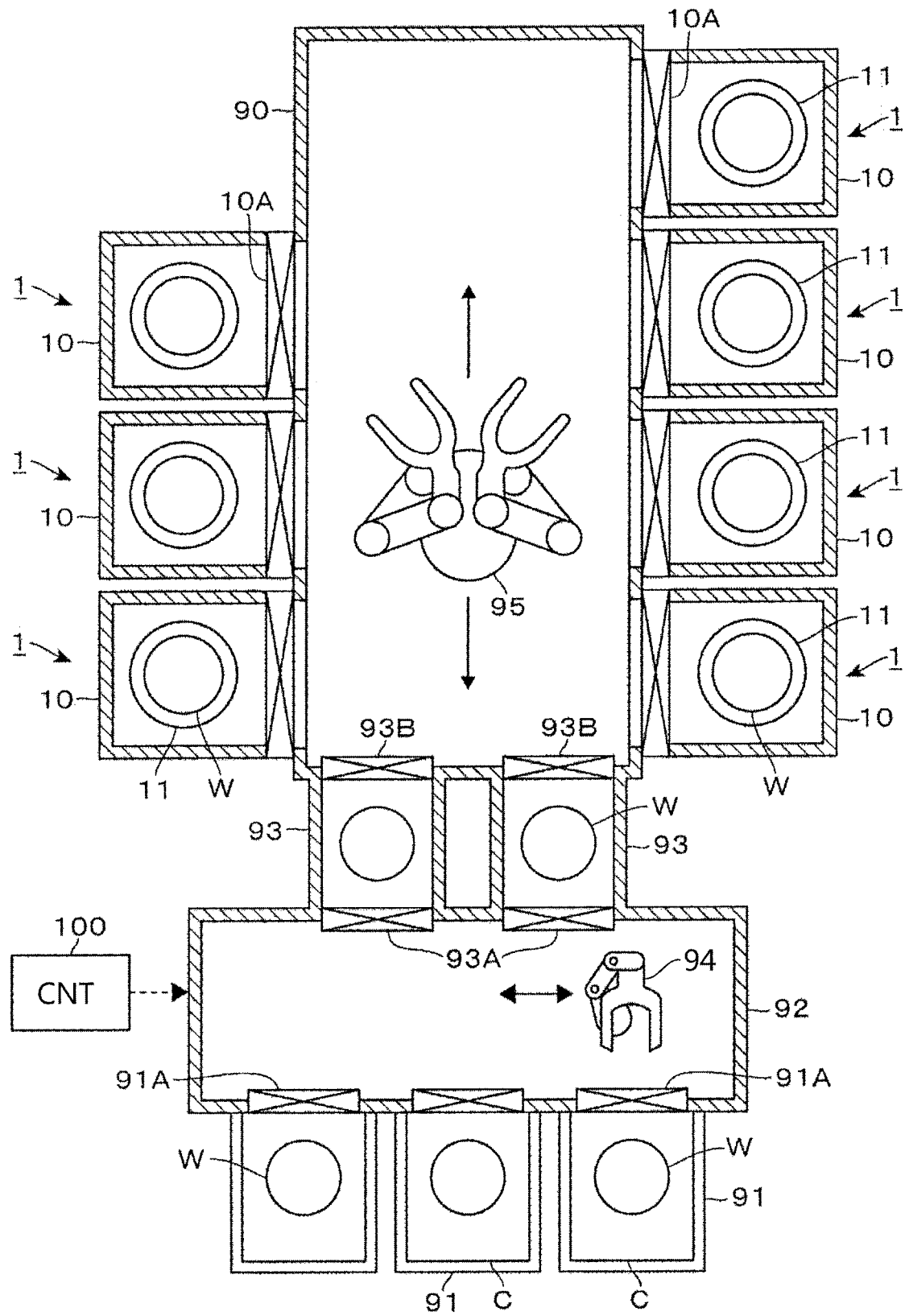
FIG. 2 is a plan view showing the vacuum processing system.

A vacuum processing system to which a substrate processing apparatus according to an embodiment is applied will be described. As shown in FIGS. 1 and 2, the vacuum processing system includes three loading/unloading ports 91. Each loading/unloading port 91 has a mounting table 99 for mounting thereon a carrier C that is a transfer container for accommodating a semiconductor wafer (hereinafter, referred to as "wafer") W serving as a substrate. The loading/unloading ports 91 are connected to a normal pressure transfer chamber 92.

Hereinafter, descriptions will be made assuming that the loading/unloading port 91 side is referred to as a front side and the normal pressure transfer chamber 92 side is referred to as a rear side. A reference numeral '91A' shown in FIG. 2 indicates a door that is opened together with a lid of the carrier C.

The normal pressure transfer chamber 92 is a rectangular normal pressure transfer chamber 92 extending in a left-right direction, and an inner space thereof is maintained in a normal pressure atmosphere (an atmospheric atmosphere in the case of air) in which a downflow of clean air is generated.

Further, as shown in FIG. 2, a normal pressure transfer mechanism 94 is provided in the normal pressure transfer chamber 92 to transfer the wafer W to the carrier C on the loading/unloading port 91 under the normal pressure atmosphere. The normal pressure transfer mechanism 94 is configured as a rotatable joint arm. Further, the normal pressure transfer mechanism 94 is configured to reciprocate along a guide rail (not shown) that is disposed on a bottom surface of the normal pressure transfer chamber 92 and extends along a longitudinal direction of the normal pressure transfer chamber 92.

On the rear side of the normal pressure transfer chamber 92, two load-lock modules 93 are provided side by side in the left-right direction via respective gate valves 93A. Each load-lock module 93 includes a wafer mounting portion (not shown), and an inner atmosphere thereof can be switched between a normal pressure atmosphere and a vacuum atmosphere.

A vacuum transfer chamber 90 maintained in a vacuum atmosphere is connected to the rear side of the load-lock modules 93 through respective gate valves 93B. The vacuum transfer chamber 90 in this example is formed in a substantially rectangular shape extending in the front-rear direction. Four processing modules 1 are arranged side by side in the front-rear direction on the right side of the vacuum transfer chamber 90 when viewed from the front side. Three processing modules 1 are arranged side by side in the front-rear direction on the left side of the vacuum transfer chamber 90. The processing module 1 corresponds to the substrate processing apparatus of the embodiment.

Further, as shown in FIG. 2, a vacuum transfer mechanism 95 is provided in the vacuum transfer chamber 90 for transferring the wafer W between the processing modules 1 and the load-lock modules 93 in the vacuum atmosphere. The vacuum transfer mechanism 95 is configured as a joint arm that is movable in the front-rear direction along a guide rail (not shown) disposed on a bottom surface of the vacuum transfer chamber 90.

Figure 3:
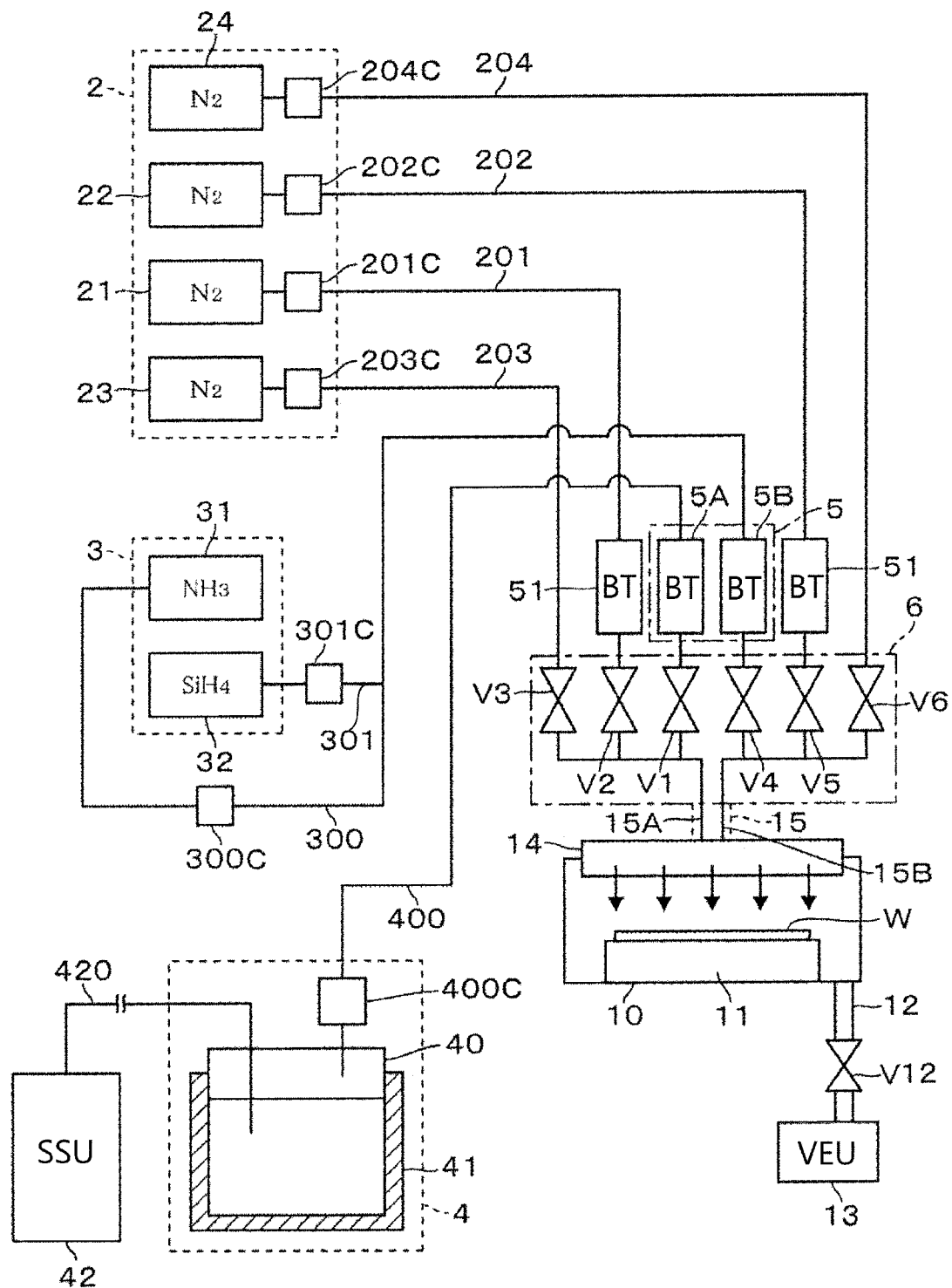
FIG. 3 is a system diagram showing a gas supply system of a processing module.

Next, the processing module 1 that is the substrate processing apparatus will be described. The processing module 1 in this example includes a processing chamber 10, and configured as a film forming apparatus in which a trimethylaluminum (TMA) gas that is a source gas and a gaseous mixture of an ammonia ($NH_3$) gas and a silane ($SiH_4$) gas are alternately and repeatedly supplied to the wafer W placed in the processing chamber 10 to form an AlN film. FIG. 3 is a system diagram showing a gas supply system in the processing module 1.

As shown in FIG. 2, the processing chamber 10 includes a mounting table 11 on which the wafer W is mounted. A heating unit (not shown) for heating the wafer W is embedded in the mounting table 11. In addition, a shower head 14 is provided on a ceiling surface of the processing chamber 10 so that each gas can be supplied to the wafer W from a surface of the shower head that faces the wafer W mounted on the mounting table 11. The shower head 14 may serve as an upper electrode to which a high-frequency current is applied, and may be configured to form a high-frequency electric field between the shower head 14 and a lower electrode embedded in the mounting table 11. Therefore, the plasma of a gas such as $NH_3$ gas or $N_2$ gas to be described later, which is supplied to the processing chamber 10, can be generated. One end of a gas exhaust line 12 is connected to the processing chamber 10, and the other end of the gas exhaust line 12 is connected to a vacuum exhaust unit (VEU) 13. A reference symbol 'V12' shown in FIG. 3 indicates an opening/closing valve that opens and closes the gas exhaust line 12.

The processing module 1 includes a TMA supply unit 40, which is a source gas supply unit for containing TMA as a source material and supplying a source gas toward the processing chamber 10. The TMA is liquid at normal temperature and normal pressure (i.e., 25° C. and 1 atm) and, for example, the TMA stored in an external main source storage unit (SSU) 42 can be supplied to the TMA supply unit 40 through a TMA supply line 420. A heating unit 41 including, e.g., a mantle heater is provided to surround and cover the TMA supply unit 40 so that the TMA stored in the TMA supply unit 40 can be heated to a temperature of, e.g., 60° C. at which the TMA vaporizes. One end of a source gas supply line 400 for supplying the vaporized TMA therethrough is connected to a ceiling portion of the TMA supply unit 40.

A reference numeral '400C' provided in the source gas supply line 400 indicates a mass flow controller (MFC). The other end of the source gas supply line 400 is connected to a supply on/off valve V1 in a valve device 6 to be described later through a buffer tank (BT) 5A that temporarily stores the TMA gas received from the TMA gas supply unit 40. The TMA supply unit 40, the MFC 400C, and the heating unit 41 are accommodated in a source gas box 4 to be described later. The source gas supply line 400 is wound by a tape heater (not shown) and heated to a temperature at which the TMA gas is not liquefied.

Further, the processing module 1 includes an $NH_3$ gas supply unit 31 and an $SiH_4$ gas supply unit 32 for respectively supplying the $NH_3$ gas and the $SiH_4$ gas as reaction gases to the processing chamber 10. One end of a reaction gas supply line 300 is connected to the $NH_3$ gas supply unit 31, and the other end of the reaction gas supply line 300 is connected to a supply on/off valve V4 in the valve device 6 to be described later through an MFC 300C and a buffer tank (BT) 5B.

Further, one end of an $SiH_4$ gas supply line 301 is connected to the $SiH_4$ gas supply unit 32, and the other end of the $SiH_4$ gas supply line 301 is joined with the reaction gas supply line 300 through a MFC 301C. The $NH_3$ gas supply unit 31 and the $SiH_4$ gas supply unit 32 are arranged in a process gas box 3 to be described later.

Further, the processing module 1 includes replacement gas supply units 21 and 22 for respectively supplying replacement gases to the processing chamber 10 in order to replace the atmosphere in the processing chamber 10, and counter gas supply units 23 and 24 for respectively supplying counter gases. The counter gas is supplied to prevent other gases from flowing into the gas supply line when the supply of the source gas or the reaction gas is stopped. In this example, a nitrogen ($N_2$) gas that is an inert gas is used as the replacement gas and the counter gas. One ends of replacement gas supply lines 201 and 202 are connected to the replacement gas supply units 21 and 22, respectively, and the other ends of the replacement gas supply lines 201 and 202 are connected to supply on/off valves V2 and V5 in the valve device 6 to be described later through flush purge buffer tanks (BT) 51, respectively.

One ends of counter gas supply lines 203 and 204 are connected to the counter gas supply units 23 and 24, respectively, and the other ends of the counter gas supply lines 203 and 204 are connected to supply on/off valves V3 and V6 in the valve device 6 to be described later. The replacement gas supply lines 201 and 202 and the counter gas supply lines 203 and 204 are provided with MFCs 201C to 204C, respectively. The replacement gas supply units 21 and 22, the counter gas supply units 23 and 24, and the MFCs 201C to 204C are arranged in an inert gas box 2 to be described later.

In this example, the configuration in which the replacement gas supply units 21 and 22 and the counter gas supply units 23 and 24 are arranged in the inert gas box 2 is employed. However, the configuration in which the MFCs 201C to 204C are arranged only in the inert gas box 2 and the replacement gases and the counter gases are supplied to the inert gas box 2 from the outside may be employed. In such a configuration, gas supply lines for supplying the replacement gases and gas supply lines for supplying the counter gases to the MFCs 201C to 204C correspond to the replacement gas supply units and the counter gas supply units.

In the valve device 6, the supply on/off valves V1 to V6 are collectively arranged to supply each of the TMA gas, the gaseous mixture of the $NH_3$ gas and the $SiH_4$ gas, the replacement gas and the counter gas into the processing chamber 10, or shut-off the supply of each of the above gases. Connected to the valve device 6 are a source gas supply line 15A for supplying the TMA gas from the valve device 6 to the shower head 14 and a reaction gas supply line 15B for supplying a reaction gas that is a gaseous mixture of the $NH_3$ gas and the $SiH_4$ gas. In this example, the valve device 6 corresponds to a valve arrangement unit in which the supply on/off valves V1 to V6 are arranged.

Figure 4:
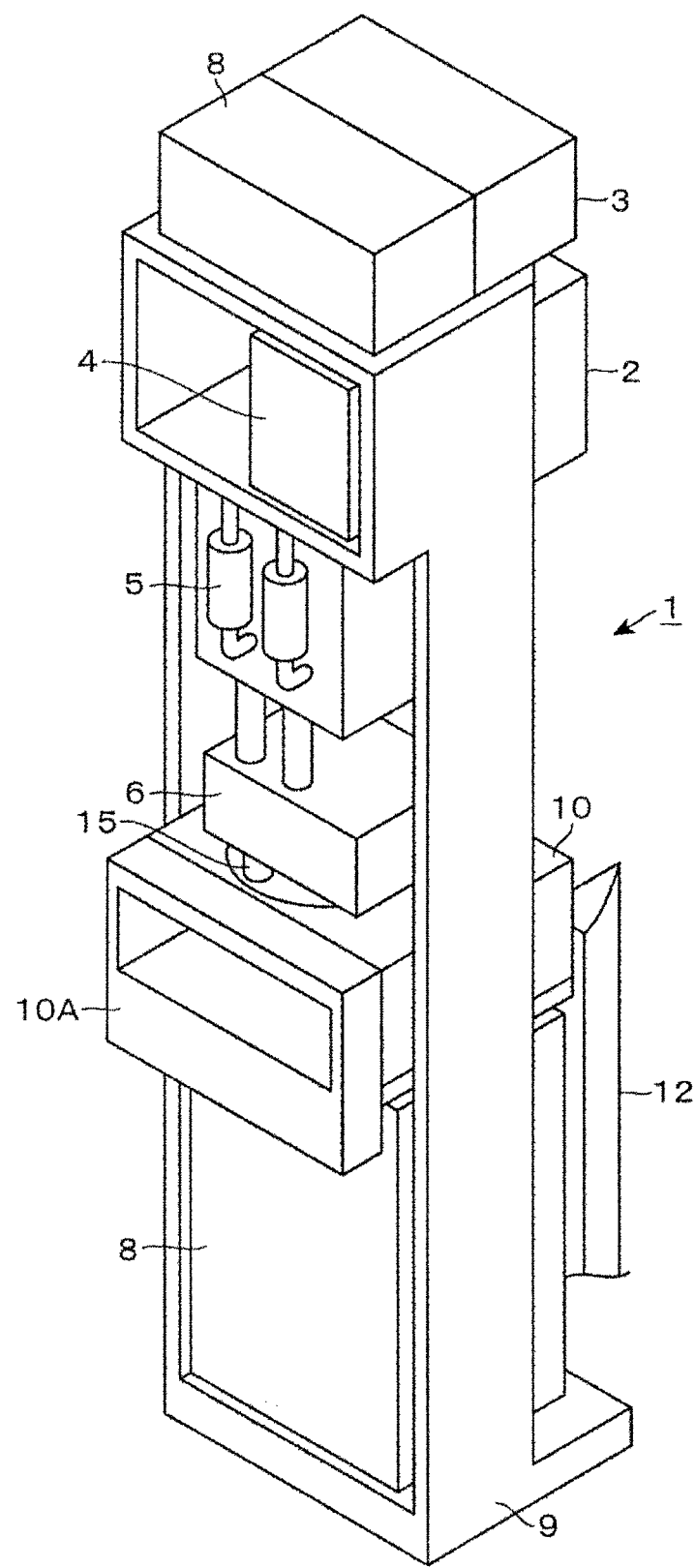
FIG. 4 is a perspective view of the processing module.
Figure 5:
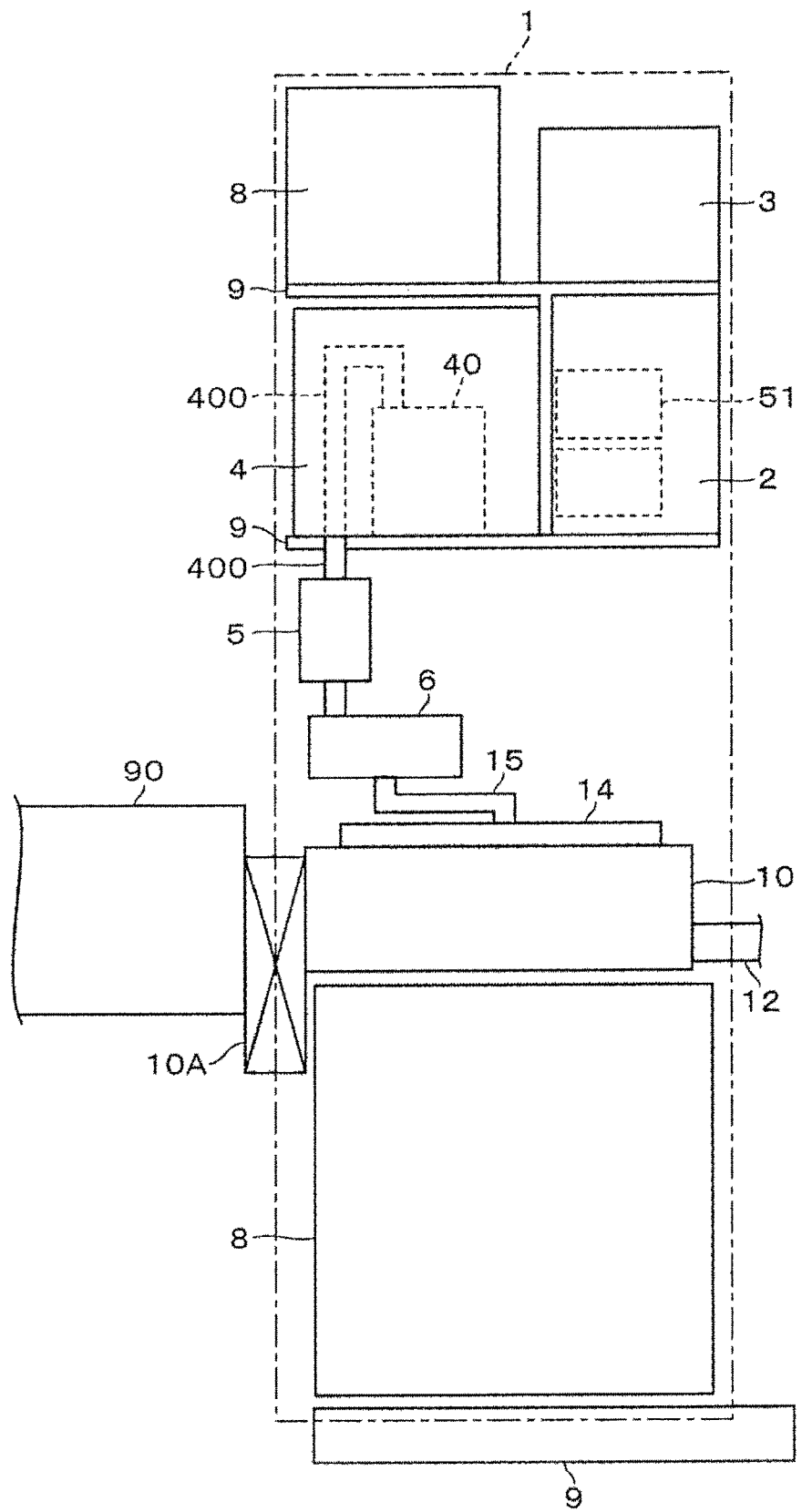
FIG. 5 is a side view of the processing module.

Next, the arrangement of respective parts in the processing module 1 will be described with reference to FIGS. 4 and 5 that show a perspective view and a side view of the processing module 1, respectively. The processing module 1 is configured in a tower shape in which respective parts are supported by a shelf-like support member 9. In FIGS. 4 and 5, the descriptions of gas supply lines other than a gas line unit 15 and the source gas supply line 400 through which the TMA gas flows are omitted to avoid complicated descriptions.

The processing chamber 10 connected to the vacuum transfer chamber 90 via a gate valve 10A is disposed around a middle stage of the tower-shaped processing module 1. As described above, multiple processing modules 1 are provided on each of the left side surface and the right side surface of the vacuum transfer chamber 90. Therefore, when viewed from the above, the vacuum transfer chamber 90 is configured to include side surfaces facing each other, and multiple processing chambers 10 are arranged side by side along each of the left side surface and the right side surface of the vacuum transfer chamber 90. Further, the vacuum transfer chamber 90 is supported by a support (not shown) provided on the bottom surface of the vacuum transfer chamber 90 and is fixed at the same height as the processing chamber 10.

In addition, one end of the gas exhaust line 12 is connected to a surface of the processing chamber 10 that is opposite to a surface of the processing chamber 10 connected to the vacuum transfer chamber 90. The gas line unit 15 including the source gas supply line 15A and the reaction gas supply line 15B is connected to an upper surface of the shower head 14 of the processing chamber 10, and the valve device 6 connected to the gas line unit 15 is disposed above the processing container 10.

Further, a buffer tank unit 5 including the buffer tanks 5A and 5B is disposed above the valve device 6.

Furthermore, the source gas box 4, the inert gas box 2, the process gas box 3, and electrical equipment 8 are disposed above the buffer tank unit 5. Accordingly, in view of the supply system of the source gas, the valve device 6 that is the valve arrangement unit, the buffer tank 5A and the TMA supply unit 40 are arranged, in this order, above the processing chamber 10 from the lower side to the upper side.

The source gas box 4, the inert gas box 2, the process gas box 3 and the electrical equipment 8 are arranged above the buffer tank unit 5 or the processing chamber 10, and are supported by the shelf-like support member 9. As shown in FIGS. 4 and 5, two sets are arranged in upper and lower stages in a side view of the processing module 1.

In FIGS. 4 and 5, when a direction in which the vacuum transfer chamber 90 is provided when viewed from the processing chamber 10 is referred to as an inner side and the opposite direction thereto is referred to as an outer side, the source gas box 4 and the inert gas box 2 are arranged at the inner side and the outer side of the lower stage, respectively, and the electrical equipment 8 and the process gas box 3 are arranged at the inner side and the outer side of the upper stage, respectively. In the above configuration, the inert gas box 2 and the process gas box 3 constitute the gas box of this example.

The source gas box 4 has an access surface for accessing the TMA supply unit 40 from the vacuum transfer chamber 90 side. On the access surface, for example, an opening/closing door (not shown) of the source gas box 4 that can be opened and closed is arranged.

Further, the inert gas box 2 provided on the other side (outer side) of the source gas box 4 when viewed from the vacuum transfer chamber 90 includes the replacement gas supply units 21 and 22, the counter gas supply units 23 and 24 and the MFCs 201 to 204. However, the replacement gas supply units 21 and 22 and the counter gas supply units 23 and 24 may not be provided in the inert gas box 2, and the MFCs 201 to 204 may be connected to gas supply lines from an inert gas supply unit on the facility side to allow the inert gas to be supplied through the gas supply lines. Further, as indicated by a dotted line shown in FIG. 5, the buffer tank for temporarily storing the replacement gas shown in FIG. 3 is provided on the side of the inert gas box 2 when viewed from the vacuum transfer chamber 90.

The process gas box 3 arranged at the outer side of the upper stage (on the side opposite of the side where the vacuum transfer chamber 90 is arranged) includes a process gas supply unit, the MFC and the like. The electrical equipment 8 arranged at the inner side of the upper stage (on the side where the vacuum transfer chamber 90 is arranged) includes, e.g., a device for supplying power for driving the processing module 1.

As shown in FIG. 2, the vacuum processing system includes a controller (CNT) 100 for controlling the transfer of the wafer W in the vacuum processing system, a film forming process in the processing module 1, and the like. For example, the controller 100 is, e.g., a computer including a CPU and a storage unit (both not shown). The storage unit stores therein a recipe for the film forming process including the supply or the shut-off of the supply of each gas by controlling the supply on/off valves V1 to V6 in the processing module 1 and/or a program having a group of steps (commands) for transferring the wafer W using the normal pressure transfer mechanism 94 and the vacuum transfer mechanism 95 in the vacuum processing system. The program is stored in a storage medium such as a hard disk, a compact disk, a magnetic optical disk, or a memory card, and is installed in the computer therefrom.

Next, the operation of the above embodiment will be described. When the carrier C accommodating the wafers W is mounted on the loading/unloading port 91, one of the wafers W in the carrier C is taken out by the normal pressure transfer mechanism 94 and is transferred to the load lock module 93 and then to the vacuum transfer chamber 90. Further, the wafer W is transferred from the vacuum transfer chamber 90 to the processing chamber 10 of each processing module 1 by the vacuum transfer mechanism 95.

In the processing module 1, at first, the wafer W is transferred into the processing chamber 10 by the vacuum transfer mechanism 95 in a state where the supply on/off valves V1 to V6 are closed, and the transferred wafer W is mounted on the mounting table 11. After the vacuum transfer mechanism 95 is retreated from the processing chamber 10, the gate valve 10A is closed. Further, the wafer W is heated to, e.g., 450° C. by the heating unit of the mounting table 11. Further, the pressure inside of the processing chamber 10 is adjusted by the vacuum exhaust unit 13.

Then, the supply on/off valves V3 and V6 are opened, and the counter gas ($N_2$ gas) is supplied from each of the counter gas supply units 23 and 24 to the source gas supply line 15A and the reaction gas supply line 15B, respectively. Meanwhile, the TMA supply unit 40 is heated, and the TMA gas is stored in the buffer tank 5A. Further, the $NH_3$ gas and the $SiH_4$ gas respectively supplied from the $NH_3$ gas supply unit 31 and the $SiH_4$ gas supply unit 32 are stored in the buffer tank 5B. Thereafter, the supply on/off valve V1 is opened, and the TMA gas stored in the buffer tank 5A is supplied into the processing chamber 10 through the shower head 14. Accordingly, the TMA gas supplied into the processing chamber 10 is adsorbed to the wafer W.

In parallel with the supply of the TMA gas to the wafer W in the processing chamber 10, the replacement gas is stored in each of the buffer tanks 51. Thereafter, the supply on/off valve V1 is closed and the supply on/off valves V2 and V5 are opened. Accordingly, the supply of the TMA gas into the processing chamber 10 is stopped, and the replacement gas stored in each of the buffer tanks 51 is supplied into the processing chamber 10. As a result, the TMA gas remaining in the processing chamber 10, which is adsorbed on the wafer W but remains unreacted, is removed.

Subsequently, the supply on/off valves V2 and V5 are closed and the supply on/off valve V4 is opened. Therefore, the supply of the replacement gas to each of the source gas supply line 15A and the reaction gas supply line 15B is stopped, and the $NH_3$ gas and the $SiH_4$ gas stored in the buffer tank 5B are supplied into the processing chamber 10. As a result, the nitriding reaction of the TMA gas adsorbed with high in-plane uniformity of the wafer W proceeds, and a thin layer of AlN is formed as a reaction by-product.

Thereafter, similarly, the replacement gas stored in each of the buffer tanks 51 is supplied into the processing chamber 10 to replace the atmosphere in the processing chamber 10. When a cycle in which the TMA gas, the replacement gas, the gaseous mixture of the $NH_3$ gas and the $SiH_4$ gas, and the replacement gas are supplied to the wafer W in that order is set to be one cycle, thin layers of AlN are deposited on the surface of the wafer W by repeating this cycle, thereby forming an AlN film. Then, when a predetermined number of cycles are performed, the wafer W is unloaded from the processing chamber 10 in a reverse sequence to the steps of loading the wafer W into the processing chamber 10.

Here, when it is assumed that the TMA supply unit 40 is arranged below the processing chamber 10, the TMA gas having a relatively large specific gravity is supplied upward so that pressure energy for supplying the TMA gas against gravity is increased. Further, it is necessary to draw and extend the source gas supply line 400 for supplying the source gas from a position below the processing chamber 10 up to an upper surface side of the processing chamber 10 where the shower head 14 is disposed through the sidewall of the processing chamber 10. Therefore, the pressure loss of the source gas supply line 400 increases. Further, it is problematic that the supply of the source gas to the processing chamber 10 becomes unstable, a thicker gas supply line is required to be arranged to reduce the pressure loss, and the arrangement space for the gas supply line increases.

Furthermore, when a mechanism for heating such a lengthened source gas supply line 400 or maintaining the temperature of the lengthened source gas supply line 400 is necessarily provided to prevent the source gas from being liquefied due to the temperature decrease of the source gas while flowing through the source gas supply line 400, the equipment cost increases.

In the processing module 1 according to the embodiment of the present disclosure, the source gas flows downward in the order of the buffer tank 5A and the supply on/off valve V1 and is supplied to the processing chamber 10. Therefore, the TMA gas is hardly supplied against gravity and the pressure loss is reduced, so that the supply of the TMA gas to the processing chamber 10 can be stabilized. Further, in the example shown in FIG. 5, the source gas supply line 400 is connected to and bent at an upper surface of the TMA supply unit 40 such that the TMA gas is first extracted upward (flowing upward) and flows downward. However, as compared with the above described case where the TMA supply unit 40 is arranged below the processing chamber 10, the distance in which the TMA gas flows upward can be set to be in a very short range.

Further, when focusing on the operability of the processing module 1, it may be necessary to perform maintenance of, e.g., the gas supply unit while the vacuum processing system is in use. In particular, as for the source gas such as the TMA gas, the supply flow rate thereof needs to have sufficiently high accuracy. Therefore, higher accuracy in maintenance is required for the source gas box 4 compared to the other boxes including the inert gas box 2, the process gas box 3, the electric equipment 8 and the like. This may increase the maintenance frequency.

In view of the above, in the processing module 1 of the present embodiment, since the source gas box 4 is arranged above the processing chamber 10, it is necessary to work at a higher location compared to the case where the source gas box 4 is arranged below the processing chamber 10. In addition, when the source gas box 4 is provided on the side ("the outer side" previously described) opposite to the side where the vacuum transfer chamber 90 is provided, it is necessary to perform maintenance by installing a scaffold such as a stepladder.

Figure 6:
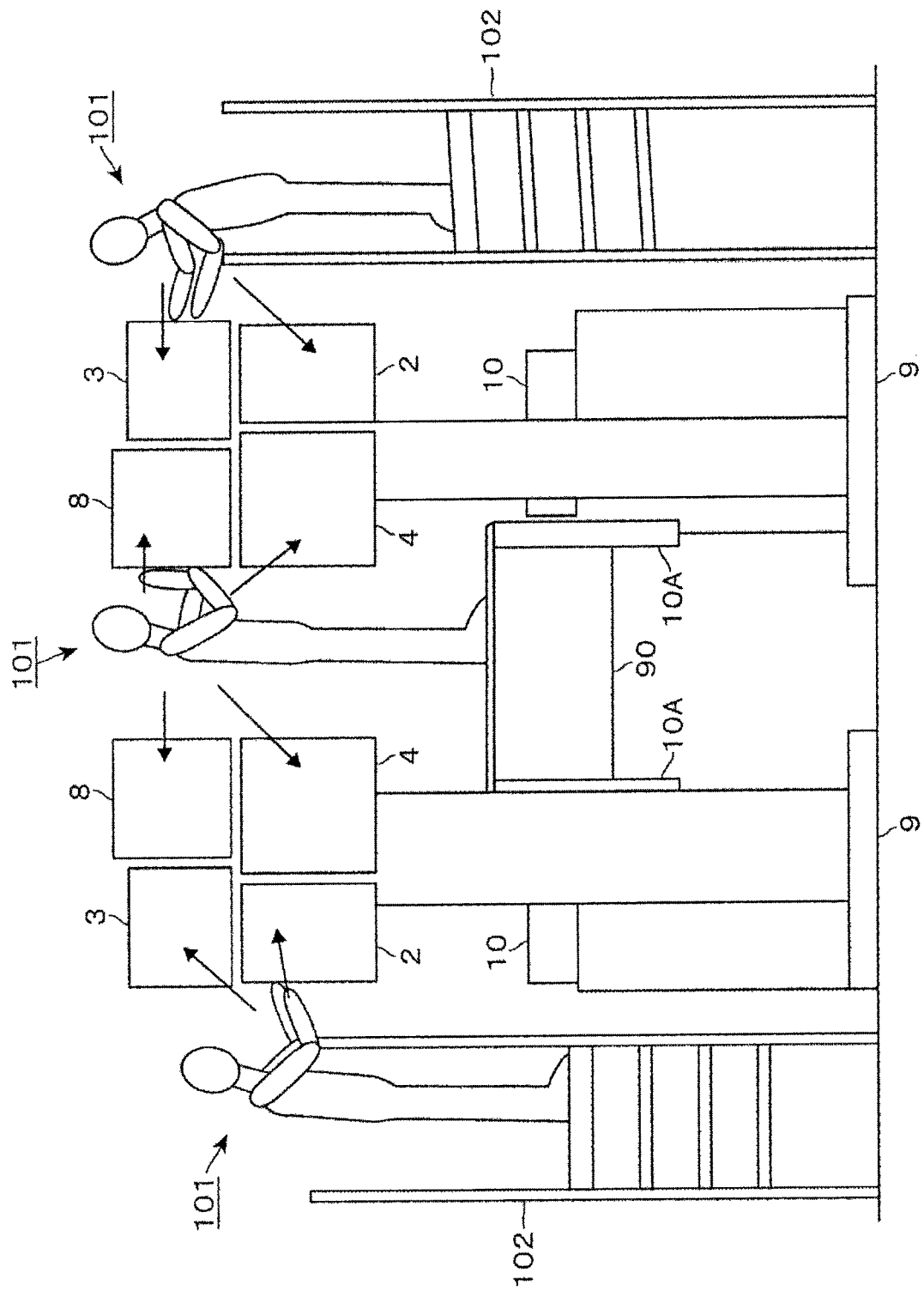
FIG. 6 shows an example of maintenance of the processing module.

Therefore, in the vacuum processing system according to the present embodiment, the source gas box 4 is provided at a position ("the inner side" previously described) facing the vacuum transfer chamber 90. With such an arrangement, as shown in FIG. 6, when the maintenance of the source gas box 4 is performed, an operator 101 can work on top of the vacuum transfer chamber 90. Accordingly, it is not necessary to install the stepladder 102 or the like when performing the maintenance such as the replacement of the source gas box 4 that takes time and is frequently performed. Further, since the work can be carried out on top of the vacuum transfer chamber 90 that is fixedly installed and has sufficient strength, the maintenance can be performed in a more stable state compared to the work performed on the stepladder 102 or the like. Furthermore, when performing the maintenance of the source gas boxes 4 of multiple processing modules, since the source gas boxes 4 are provided on the inner side, the operator's workspace can be reduced as compared with the case of being provided on the outer side. As a result, the maintenance time can be shortened, which leads to an improvement in the apparatus operation rate.

Further, according to the processing module 1 described above in which the source material of the TMA is vaporized and supplied to the processing chamber 10 to perform the substrate processing, the valve device 6, the buffer tank unit 5, and the TMA supply unit 40 are arranged, in this order, above the processing chamber 10 from the bottom side of the processing module 1. Therefore, since the valve device 6, the buffer tank unit 5, and the TMA supply unit 40 can be arranged at a region above the processing chamber 10, the footprint of the apparatus can be reduced. Further, since the TMA gas can be supplied from the upper side to the lower side by being moved downward by gravity, the pressure loss of the TMA gas is reduced so that the TMA gas can be stably supplied to the processing chamber 10. In addition, the distance from the TMA supply unit 40 to the processing chamber 10 is shortened, which makes it difficult to cool the TMA gas. Therefore, even when a heating mechanism such as a tape heater is provided on the source gas supply line 400, the installation range can be reduced.

In addition, by providing the source gas box 4 including the TMA supply unit 40 on the vacuum transfer chamber 90 side and arranging it above the processing chamber 10, the operator 101 can perform the maintenance in the source gas box 4 on top of the vacuum transfer chamber 90. Therefore, when the maintenance of the source gas box 4 that requires a great deal of time is performed, it is not necessary to prepare the stepladder 102 and the like and the maintenance can be performed on top of the stable scaffold.

Further, the source gas supply unit may contain a solid source material such as $WCl_5$, $WCl_6$, or the like, and the source gas obtained by vaporizing the solid source material may be supplied to the processing chamber 10. Alternatively, when a liquid source material such as $TiCl_4$ is used, the source material stored in the source gas supply unit may be heated and vaporized, or may be vaporized by injecting the $N_2$ gas to the liquid source material, for example.

Further, when the gas supply line extending from the source gas supply unit to the processing chamber 10 is lengthened, the pressure loss is increased and the source gas is easily cooled. In that case, it is preferred that the height difference between the height position of the processing chamber 10 where the source gas is introduced and the height position of the surface of the solid source material or the liquid source material contained in the source gas supply unit is within a range from 600 mm to 1200 mm.

The source gas in a gaseous state may be contained in the source gas supply unit, and the source gas may be supplied to the processing chamber after being heated in the source gas supply unit. For example, although $WF_6$ is a source material in a gaseous state, the source gas thereof may be heated and supplied to the processing chamber 10 in some cases. When such a gas is employed, it is necessary to provide a source gas heating mechanism or the like in the source gas supply unit. When the source gas heating mechanism is provided, it takes time to perform the apparatus maintenance. Therefore, by providing the source gas supply unit having the heating mechanism in the source gas box 4, the above-described effect can be obtained.

Further, in the conventional vacuum processing system, the processing module 1 is connected to each side of the vacuum transfer chamber 9 having a polygonal planar shape. In this case, a space for providing a gas supply system for supplying gas to the processing chamber 10 may be provided beside each processing module 1.

In contrast, as described with reference to FIG. 2, in the case where the multiple processing modules 1 are arranged on each of both side surfaces of the vacuum transfer chamber 9 with a small gap therebetween, a space for providing the above-described gas supply system cannot be ensured. In this connection, if the source gas supply system is provided at the outer side of the processing module 1 when viewed from the vacuum transfer chamber 90, the vacuum processing system cannot be downsized. Further, the problem of arranging the gas supply system below the processing chamber 10 is already described above.

In view of the above, the processing module 1 according to the embodiment of the present disclosure has the configuration in which the gas supply system is arranged above the processing chamber 10. As a result, even when the multiple processing modules 1 are arranged side by side along each of the left side surface and the right side surface of the vacuum transfer chamber 90 as shown in FIG. 2, it is possible to avoid the increase in size of the apparatus due to the expansion of the space for providing the gas supply system and the like.

Figure 7:
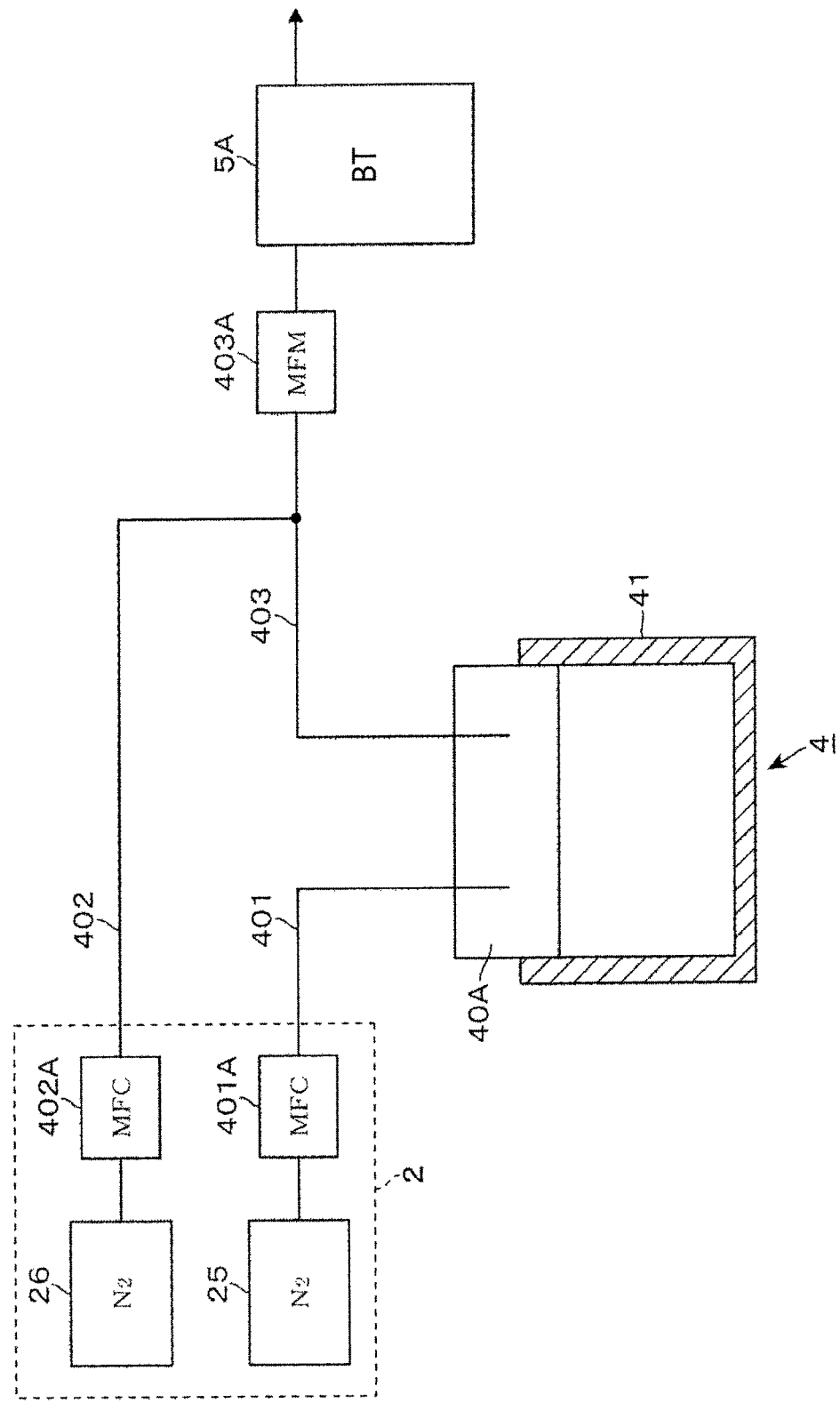
FIG. 7 shows a configuration of a modification of a processing module.

Here, an example of a modification of the gas supply system will be described. The process gas box 3 may include gas supply units for, e.g., a combustion gas, a combustion support gas and a cleaning gas for cleaning the inside of the processing chamber 10. Further, as shown in FIG. 7, the inert gas box 2 may include a carrier gas supply unit 25 for supplying $N_2$ gas, which is a carrier gas to be supplied together with the source gas to the processing chamber 10, to a source gas supply unit 40A. In this modification example, a carrier gas supply line 401 through which the carrier gas is supplied from the carrier gas supply unit 25 is connected to the source gas supply unit 40A. A source gas supply line 403 is connected to an offset gas supply line 402 through which $N_2$ gas that is an offset gas is supplied from an offset gas supply unit 26. The carrier gas supply line 401 and the offset gas supply line 402 are provided with MFCs 401A and 402A, respectively. Reference numeral '403A' in the source gas supply line 403 indicates a mass flow meter (MFM).

In this modification example, when the remaining amount of the source material in the source gas supply unit 40A is reduced, the pick-up amount of the source gas per unit flow rate of the carrier gas is reduced and the concentration of the source gas decreases. Therefore, the flow rate of the carrier gas is adjusted by adjusting the flow rate of the MFC 401A according to the pickup amount of the source gas to thereby adjust the supply amount of the source gas. Further, the flow rate of the offset gas is adjusted by adjusting the flow rate of the MFC 402A based on the flow rate of the carrier gas to make the total flow rate of the gas supplied to the buffer tank 5A constant.

In such a processing module 1, since the flow rate of the carrier gas is adjusted according to the remaining amount of the source material, the flow rate of the carrier gas may be reduced to about 10 cc. If the length of the carrier gas supply line 401 from the carrier gas supply unit 25 to the source gas supply unit 40A is long, the time period until the carrier gas is supplied to the source gas supply unit 40A becomes longer. In addition, when the supply and the shut-off of the supply of the carrier gas or the flow rate adjustment are performed, the response time until the flow rate of the carrier gas that actually flows into the source gas supply unit 40A is changed becomes longer. At this time, if the flow rate of the carrier gas is small, the error rate in the flow rate of the carrier gas increases.

Therefore, as in the processing module 1 of the embodiment of the present disclosure, the carrier gas box 2 and the source gas box 3 are provided to be adjacent to each other, thereby shortening the length of the carrier gas supply line 401. As a result, the responsiveness of the flow rate of the carrier gas that flows into the source gas supply unit 40A when adjusting the flow rate of the carrier gas and the like is improved. Accordingly, even when the flow rate of the carrier gas is small, the error rate in the flow rate of the carrier gas is reduced.

In the above described embodiments, the example in which the source gas supply unit (TMA supply unit 40 in this present embodiment) is arranged above the processing chamber 10 in the processing module 1 that performs vacuum processing of an atomic layer deposition (ALD) has been described. However, the vacuum processing to which the above described configuration can be applied is not limited to the ALD, and may be a chemical vapor deposition (CVD) that continuously supplies a source gas. In this case, the installation of the buffer tanks 5A and 5B between the source gas supply unit and the processing chamber 10 may be omitted.

While certain embodiments have been described, these embodiments have been presented by way of example only, and are not intended to limit the scope of the disclosures.

Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

For example, the configuration in which the process gas supply unit is installed in the process gas box has been described. However, the gas supply unit installed in the facility such as a factory may be utilized. In this case, the gas supply unit in the facility may be connected to the MFC installed in the process gas box through a gas supply line.

The invention claimed is:

1. A substrate processing apparatus for performing substrate processing by supplying, to a substrate, a source gas containing a source material of a film to be formed on the substrate, the substrate processing apparatus comprising:
a processing chamber in which the substrate is mounted;
a source gas supply unit configured to contain the source material and supply the source gas toward the processing chamber;
a buffer tank configured to temporarily store the source gas received from the source gas supply unit;
a valve arrangement unit in which supply on/off valves, each of which is configured to perform a supply and a shut-off of the supply of the source gas stored in the buffer tank to the processing chamber, are arranged; and
a vacuum transfer chamber to which the processing chamber is connected,
wherein the source gas supply unit is provided at a side where the vacuum transfer chamber is arranged when viewed from the processing chamber, and
the valve arrangement unit, the buffer tank, and the source gas supply unit are arranged, in this order, above the processing chamber from a bottom side of the substrate processing apparatus.

2. The substrate processing apparatus of claim 1, wherein the source gas supply unit contains a solid source material or a liquid source material, and a source gas obtained by vaporizing the solid source material or the liquid source material is supplied to the processing chamber.

3. The substrate processing apparatus of claim 1, wherein the source gas supply unit contains a source gas in a gaseous state, and the source gas in the gaseous state is heated in the source gas supply unit and then supplied to the processing chamber.

4. The substrate processing apparatus of claim 2, wherein a height difference between a height position where the source gas is introduced into the processing chamber and a height position of a surface of the solid source material or the liquid source material contained in the source gas supply unit is within a range from 600 mm to 1200 mm.

5. The substrate processing apparatus of claim 1, wherein, the substrate processing is a film forming processing in which the source gas and a reaction gas that reacts with the source gas to generate a reaction by-product are alternately and repeatedly supplied to the substrate in a vacuum atmosphere to thereby form a film of the reaction by-product on the substrate,
wherein the substrate processing apparatus further comprises:
a reaction gas supply unit arranged above the processing chamber and configured to supply the reaction gas toward the processing chamber; and
a replacement gas supply unit arranged above the processing chamber and configured to supply a replacement gas to be replaced with the reaction gas or the source gas toward the processing chamber, and
wherein the supply on/off valves of the valve arrangement unit include a supply on/off valve configured to perform a supply and a shut-off of the supply of the reaction gas from the reaction gas supply unit and a supply on/off valve configured to perform a supply and a shut-off of the supply of the replacement gas from the replacement gas supply unit.

6. A substrate processing system comprising:
a plurality of the substrate processing apparatuses of claim 5;
a loading/unloading port through which a transfer container accommodating the substrate is loaded and unloaded,
an atmospheric pressure transfer chamber including an atmospheric pressure transfer mechanism configured to transfer the substrate in an atmospheric pressure atmosphere to and from the transfer container on the loading/unloading port;
and
a gas box arranged above each of the processing chambers, wherein gas supply units of gases supplied to the corresponding processing chamber are disposed in the gas box, and the gas supply units include a reaction gas supply unit,
wherein the gas box has an access surface for accessing a source gas supply unit from a vacuum transfer chamber side and
the vacuum transfer chamber is connected to a plurality of the processing chambers at side surfaces thereof and is connected to the atmospheric pressure transfer chamber through a load-lock module that switches an inner atmosphere thereof between the atmospheric pressure atmosphere and a vacuum atmosphere, wherein the vacuum transfer chamber includes a vacuum transfer mechanism configured to transfer the substrate in the vacuum atmosphere between the load-lock module and each of the processing chambers.

7. The substrate processing system of claim 6, wherein a carrier gas supply unit, which is configured to supply a carrier gas to be supplied together with the source gas to the corresponding processing chamber to the source gas supply unit, is disposed in the gas box.

8. The substrate processing system of claim 6, wherein a replacement gas supply unit is disposed in the gas box.

9. The substrate processing system of claim 6, wherein the side surfaces of the vacuum transfer chamber face each other when viewed from an upper surface side of the vacuum transfer chamber, and the processing chambers are arranged side by side along each of the side surfaces.

10. A substrate processing method for performing substrate processing by supplying a source gas containing a source material of a film to be formed on a substrate from a source gas supply unit to the substrate, the substrate processing method comprising:
transferring the substrate to a processing chamber from a vacuum transfer chamber;
mounting the substrate in the processing chamber;
temporarily storing the source gas received from the source gas supply unit in a buffer tank;
supplying the source gas stored in the buffer tank to the processing chamber by using a supply on/off valve, wherein the source gas supply unit is provided at a side where the vacuum transfer chamber is arranged when viewed from the processing chamber, and a valve arrangement unit in which the supply on/off valve is arranged, the buffer tank, and the source gas supply unit are arranged, in this order, above the processing chamber from a bottom side of the substrate processing apparatus.

* * * * *